Nov. 29, 1966 E. G. CHAMBERS ET AL 3,287,795

METHODS OF ASSEMBLING ELECTRICAL COMPONENTS WITH CIRCUITS

Filed June 5, 1964 2 Sheets-Sheet 1

INVENTORS
E. G. CHAMBERS
K.W. FISHER
BY S. Gundersen
ATTORNEY

METHODS OF ASSEMBLING ELECTRICAL COMPONENTS WITH CIRCUITS

Filed June 5, 1964 2 Sheets-Sheet 2

United States Patent Office 3,287,795

Patented Nov. 29, 1966

3,287,795

METHODS OF ASSEMBLING ELECTRICAL COMPONENTS WITH CIRCUITS

Edwin G. Chambers and Kenneth W. Fisher, Columbus, Ohio, assignors to Western Electric Company, Incorporated, New York, N.Y., a corporation of New York Filed June 5, 1964, Ser. No. 373,014

2 Claims. (Cl. 29—155.5)

This invention relates to methods of assembling electrical components with a circuit and particularly relates to the assembly of electrical components such as coils with a supported circuit, for example printed circuit panels, and connecting component terminations with land areas of the printed circuits.

In the past, an electrical component, such as a coil, having leads extending therefrom was positioned in an open-ended enclosure with the leads of the coil extending through slots formed in the enclosure. Thereafter, a potting compound was deposited and cured in the enclosure to support and insulate the coil. Subsequently, the enclosed coil assembly was assembled with a support, such as a printed circuit panel, and the coil terminations were secured to the land areas of a printed circuit supported on the circuit panel. Tests were then conducted on the assembled circuit, including the coil, and in many instances the board supported a plurality of such assembled coils in a predetermined circuit design. In the event a failure in operation of one of the coils was detected, the potted coil had to be removed from the support panel, discarded, and another coil inserted to replace the defective coil. In the manufacture of systems utilizing a large number of such assembled coils, a considerable expense could be incurred in disposing of the defective coil assemblies and further, in the time and effort utilized in removing and replacing such assemblies from support panels.

It is, therefore, an object of this invention to provide new and improved methods of assembling electrical components with circuits.

Another object of the invention is the provision of new and improved methods of assembling and securing electrical components with printed circuits and support panels to readily facilitate repair of the defective assemblies during the assembly procedure.

Still another object of the invention is the provision of new and improved methods of assembling and securing electrical components with circuits, whereby rigid terminal connections with the circuits are assured and fragile component terminations are protected.

With these and other objects in view, the present invention contemplates methods of assembling electrical components to circuits, which includes attaching terminations of an exposed component to circuit terminations and thereafter encapsulating the component and the attached terminations, whereby a defective assembly can be repaired in situ as opposed to the necessity for disposal of a defective assembly previously enclosed within a potting compound.

The present invention also contemplates methods of assembling electrical components with a circuit which includes the securing of a multi-ended, unitary terminal structure with terminations of the circuit, removing a portion of the unitary structure to provide terminal ends extending from the circuit terminations and thereafter attaching terminations of the component to the terminal ends to facilitate the connection of the electrical component with the circuit.

A complete understanding of the invention may be had by reference to the following detailed description when read in conjunction with the appended drawings in which.

Figure 1:
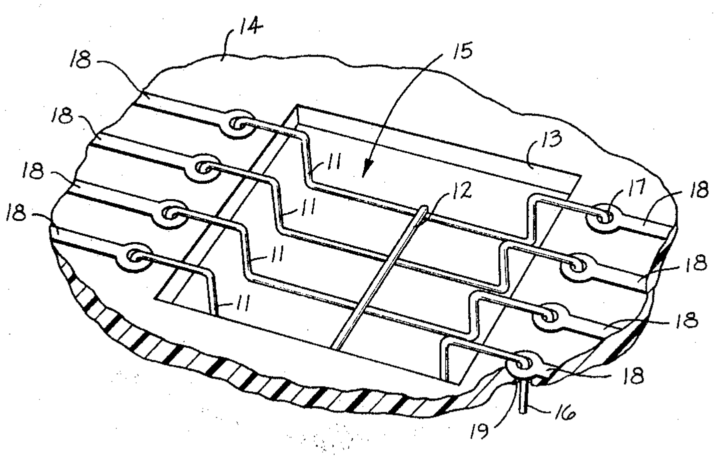
FIG. 1 is a partial perspective view showing a unitary, multi-ended, basket-like wire element assembled with land areas of a printed circuit and a support panel.

Referring now to FIG. 1, a plurality of preformed wire terminal members 11 are spaced in a parallel relation and secured transversely to a central linking element 12 to form a unitary, multi-ended, basket-like element, generally designated by the reference numeral 15, which is positioned within an opening 13 of a printed circuit panel 14. The terminal elements 11 are formed with downwardly turned free ends 16 which are aligned with and inserted through openings 17 formed in the terminating land areas of printed circuits 18 supported by the printed circuit panel 14. In addition, the ends 16 of the terminal elements 11 are inserted through apertures 19 which are formed in the printed circuit panel 14 in alignment with the apertures 17 of the printed circuits 18. It is noted that the free ends 16 of the element 15 are preformed and aligned to conform to the spacing between the apertures 19 of the panel 14.

Figure 2:
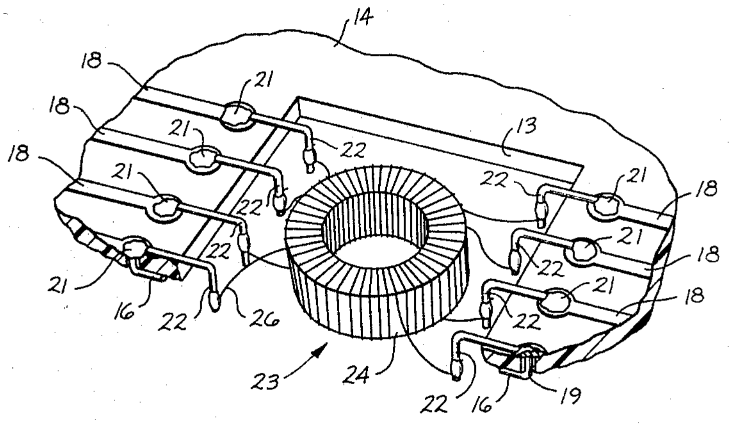
FIG. 2 is a partial perspective view showing a coil having terminations assembled with severed portions of the wire basket-like element.

As shown in FIG. 2, ends 16 of the terminal elements 11 are turned under the printed circuit panel 14, thereby mechanically securing the basket-like element 15 with the support panel 14 and precluding further movement of the multi-ended, basket-like element which includes the terminal elements 11. Subsequently, solder 21 is deposited about the assembled terminal elements 11 to secure terminal elements for electrical contact with the land areas of the printed circuits 18. Thereafter, the portion of the terminal elements 11, which is secured to the transverse linking element 12 is severed from the remaining portions of the terminal elements to provide terminals 22 which extend from the land areas of the printed circuits 18 downwardly into the opening 13 of the printed circuit panel 14. A toroidal coil, generally designated by the reference numeral 23, is provided with a ferrite core 24 and coil terminations 26 extending therefrom which are attached and soldered to free ends of the terminals 22.

By soldering the terminal elements 11 with the land areas of the printed circuits 18 prior to the assembly of the coil 23 therewith, the possibility of bits of solder spilling onto the windings of the coil is precluded. In addition, the securance of the terminal elements 11 with the land areas of the printed circuits 18 and the subsequent removal of portions of the terminal elements 11 to form the terminals 22 presents a relatively simple and inexpensive method of providing terminations for the printed circuits and further provides a means for easily attaching the fragile terminations 26 of the coil 23 thereto. Prior to the continuing of the assembling procedure, an electrical test is conducted determining the acceptability of the coil 23 as assembled with the printed circuit 18. In the event faults are detected during the testing procedure, such as misplaced wires, cold solder connections and shorted adjacent coil convolutions, the completely exposed assembly, including the coil 23, the terminations 26 attached to the terminals 22 and the solder 21, facilitates the repair of such deficiencies, thereby eliminating the necessity of disposing of the deficient assembly.

Figure 3:
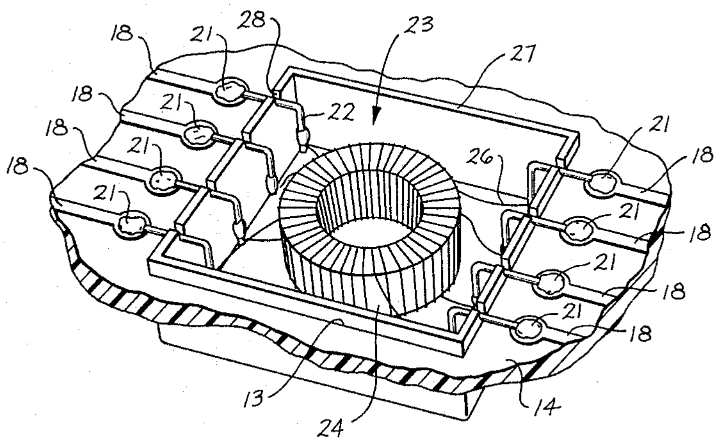
FIG. 3 is a partial perspective view showing an open plastic container assembled with the coil and support panel.
Figure 4:
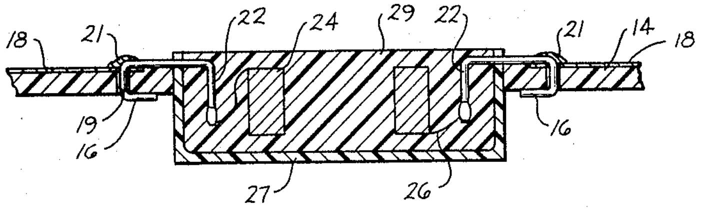
FIG. 4 is a sectional view showing a potting compound deposited in the container and about the coil in an assembled relation.

Referring to FIG. 3, subsequent to the testing procedure and any necessary repair operations, an enclosure such as a plastic container 27 is inserted into the opening 13 of the printed circuit panel 14, whereby portions of the terminals 22 are guided into spaced notches 28 formed in the plastic container. As shown in FIG. 4, a potting compound 29, such as epoxy resin, is deposited into the container 27 and flows about and encapsulates the toroidal coil 23 and the coil terminations 26 attached to the free ends of the terminals 22 where, upon curing of the potting compound, the coil assembly with the fragile terminations 26 attached to the free ends of the terminals 22 are insulated and supported in a protected manner.

It is noted that in normal manufacturing procedures, a plurality of such coil assemblies are secured to a given printed wiring panel 14, wherein tests can be simultaneously conducted and repairs effected prior to the encapsulation of the coil assembly within the potting compound 29. Thus, as previously discussed, the method of assembling the coil 23 with the printed circuit 18 prior to the encapsulation of the assembly with the potting compound facilitates a repair of defective assemblies as opposed to the necessity for disposing of defective assemblies which were assembled with the printed circuit subsequent to the potting operation. In addition to these advantages, the rigid terminals 22 are mechanically secured to the printed circuit panel 14 and electrically secured with the printed circuits 18 and are also partially encapsulated by the potting compound 29, thereby providing rigid circuit connections while precluding the necessity of exposing the fragile terminations 26 of the coil 23 to connections outside the container 27.

It will be understood that the above-described arrangements are simply illustrative of the application of the principles of the invention. Other arrangements may be devised by those skilled in the art which will embody the principles of the invention and fall within the spirit and scope thereof. Such arrangements may include the assembly of other types of electrical components such as resistors, capacitors, transistors and the like with circuit terminations wherein the components could form an active or passive network which may be encapsulated in a potting compound.

What is claimed is:

1. A method of securing an electrical component with a printed circuit supported on a panel, which includes the steps of:

assembling a multi-ended, unitary terminal structure with land areas of the printed circuit and the panel, mechanically securing the terminal structure with the panel, securing portions of the unitary structure to the land areas of the printed circuit for electrical connection, removing portions of the unitary structure to provide individual terminals extending from and secured with the land areas of the printed circuit and the support panel, attaching component terminations to free ends of the terminals extending from the printed circuit land areas, and encapsulating the component terminations and terminal ends within a potting compound.

2. A method of securing an electrical component with a printed circuit supported on a panel, which includes the steps of:

assembling a multi-ended, unitary terminal structure with land areas of the printed circuit, mechanically securing the terminal structure with the panel, securing portions of the unitary structure to the land areas of the printed circuti for electrical connection, removing portions of the unitary structure to provide individual terminals extending from and secured with the land areas of the printed circuit and the support panel, attaching component terminations to free ends of the terminals extending from the printed circuit land areas, positioning the assembled component and component terminations with the terminal ends within an enclosure, and depositing a potting compound in the enclosure to encapsulate the component, the component terminations and the terminal ends.

References Cited by the Examiner

UNITED STATES PATENTS

| | | | |
|---|---|---|---|
| 2,590,821 | 3/1952 | Kiser. | |
| 2,911,572 | 11/1959 | Francis | 29—155.5 X |
| 2,985,806 | 5/1961 | McMahon. | |
| 3,019,489 | 2/1962 | Burg | 29—155.5 X |
| 3,039,177 | 6/1962 | Burdett | 29—155.5 X |
| 3,098,950 | 7/1963 | Geshner | 29—155.5 X |

CHARLIE T. MOON, *Primary Examiner.*

WILLIAM I. BROOKS, *Examiner.*